United States Patent
Aronowitz et al.

(10) Patent No.: US 6,919,263 B2
(45) Date of Patent: Jul. 19, 2005

(54) HIGH-K DIELECTRIC GATE MATERIAL UNIQUELY FORMED

(75) Inventors: Sheldon Aronowitz, San Jose, CA (US); Vladimir Zubkov, Mountain View, CA (US); Grace Sun, Mountain View, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/643,687

(22) Filed: Aug. 19, 2003

(65) Prior Publication Data

US 2004/0089887 A1 May 13, 2004

Related U.S. Application Data

(62) Division of application No. 10/291,356, filed on Nov. 8, 2002, now abandoned.

(51) Int. Cl.$^7$ .......................................... H01L 21/3205
(52) U.S. Cl. ...................... 438/591; 438/216; 438/261; 438/287
(58) Field of Search ............................... 438/216, 261, 438/287, 591

(56) References Cited

U.S. PATENT DOCUMENTS

| | | | | |
|---|---|---|---|---|
| 3,676,756 A | * | 7/1972 | Merrin | ........................ 438/585 |
| 5,937,303 A | * | 8/1999 | Gardner et al. | ............. 438/305 |
| 6,020,024 A | * | 2/2000 | Maiti et al. | ................. 438/287 |
| 6,137,214 A | * | 10/2000 | Raina | ......................... 313/309 |

* cited by examiner

*Primary Examiner*—Kevin M. Picardat
(74) *Attorney, Agent, or Firm*—Trexler, Bushnell, Giangiorgi, Blackstone & Marr, LTD.

(57) ABSTRACT

A new relatively high-k gate dielectric gate material comprising calcium oxide will reduce leakage from the silicon substrate to the polysilicon gate, prevent boron penetration in p-channel devices, and reduce electron trapping in the dielectric. The surface of a silicon wafer is saturated with hydroxyl groups. A calcium halide, preferably calcium bromide, is heated to a temperature sufficient to achieve atomic layer deposition, and is transported to the silicon wafer. The calcium halide reacts with the hydroxyl groups. Water is added to carry away the resultant hydrogen halide. Gaseous calcium and water are then added to form a calcium oxide gate dielectric, until the desired thickness has been achieved. In an alternative embodiment of the method, the calcium halide is transported to the silicon wafer to react with the hydroxyl groups, followed by transport of gaseous water to the silicon wafer. These two steps are repeated until the desired thickness has been achieved.

8 Claims, 3 Drawing Sheets

Repeat until desired thickness has been achieved

Repeat until desired thickness has been achieved

HIGH-K DIELECTRIC GATE MATERIAL UNIQUELY FORMED

"This is a divisional of co-pending application Ser. No. 10/291,356, filed on Nov. 8, 2002 now abandoned."

BACKGROUND

Silicon dioxide ("$SiO_2$") has dominated semiconductor technology as the universal dielectric for gate material. As the overall geometry of devices has shrunk over the years, the thickness of the silicon dioxide dielectric gate also has had to be decreased. As the silicon dioxide gate thickness decreases, problems arise, such as boron penetration in p-channel devices and tunnel leakage from the silicon substrate to the polysilicon gate ultimately culminating in direct band-to-band tunneling. There is therefore a need for replacement by a suitable high-k dielectric material.

Search for suitable high-k dielectric materials has focused primarily on hafnium oxide, zirconium oxide, and related compounds. These materials present difficulties in use as a gate material, including the occurrence and control of microcrystallization, migration of zirconium to the silicon interface, and boron penetration for p-channel devices. Because these oxides cannot be exactly matched to the silicon surface, the density of interface states associated with these and similar materials remains about one to two orders of magnitude higher than for gates made of silicon dioxide, even when applied by atomic layer deposition, the most controllable deposition process.

Accordingly, a need exists for a relatively high-k (greater than 10) dielectric gate material that avoids these difficulties, reduces the chances of electrons being trapped in the dielectric, and minimizes penetration effects, yet allows for the very small equivalent oxide thicknesses required for ever smaller devices.

SUMMARY

A new relatively high-k gate dielectric gate material is identified. Calcium oxide is deposited on the silicon wafer by atomic layer deposition. It can be made sufficiently thick so as to reduce current leakage from the silicon substrate to the polysilicon gate, prevent boron penetration in p-channel devices, and reduce electron trapping in the dielectric. Calcium oxide's lack of effective electron affinity reduces electron trapping. Additionally, the calcium oxide structure provides a high barrier to boron penetration in a p-channel device.

DESCRIPTION OF THE INVENTION

The organization and manner of the structure and operation of the preferred embodiments of the invention, together with further objects and advantages thereof, may best be understood by reference to the following description, taken in connection with the accompanying drawings.

Figure 1:
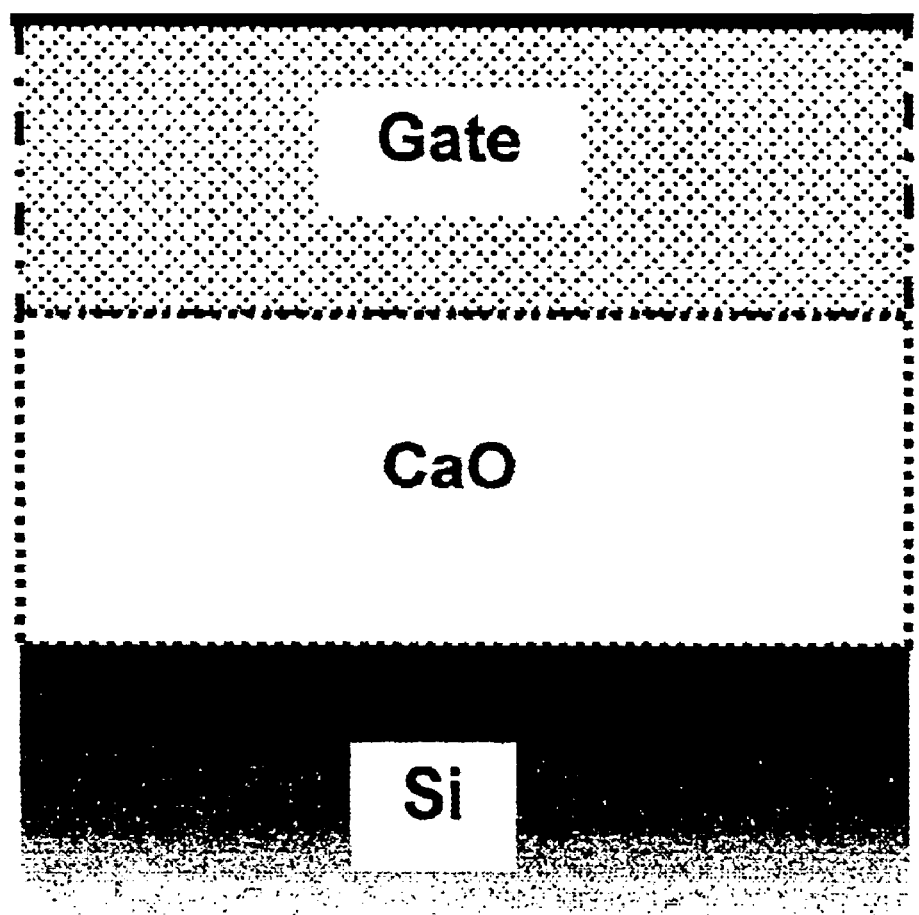
FIG. 1 is a depiction of the use of calcium oxide as a dielectric gate material on a silicon wafer.

The application of calcium oxide to the silicon wafer is accomplished by high-temperature atomic layer deposition. The use of calcium oxide is depicted in FIG. 1. The method of application is depicted in block diagram form in FIG. 2. The surface of a silicon wafer is prepared such that it is saturated with respect to hydroxyl groups (—OH) completing any dangling silicon bonds. The preparation methods are known to those skilled in the art.

In a suitable reactor, a calcium halide, preferably calcium bromide, is heated to a temperature such that its vapor pressure is sufficiently large that deposition can be achieved at a reasonable rate. For example, at 825° C., the vapor pressure of $CaBr_2$ equals approximately 5 mTorr. Under these conditions, a fully hydroxylated eight-inch silicon wafer can be completely covered in five minutes if the flow rate is 1000 sccm.

A nonreactive carrier gas, such as neon or argon, heated to the temperature of the calcium halide, transports the calcium halide to the wafer in the first step of this process. The wafer surface will be heated by the carrier gas to a sufficiently high temperature to promote a condensation reaction between the hydroxyl groups and the calcium halide. The temperature maintained at the wafer surface is such that any excess calcium halide that has not reacted with a hydroxyl group simply sublimes, that is, it cannot remain at the surface, thereby ensuring that a monolayer is formed. This first step is illustrated below using calcium bromide ($CaBr_2$):

Step 1.

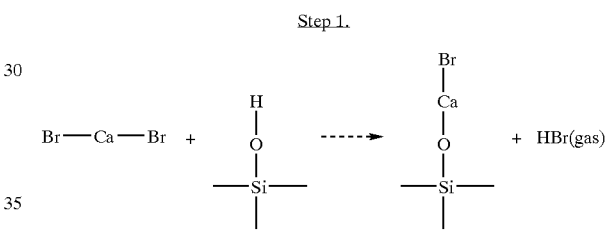

The Ca—O bond, shown above, is a very strong bond, about 4.6 eV.

Gaseous water is next transported by the heated carrier gas, to hydroxylate the calcium and release HBR (gas) in the second step:

Step 2.

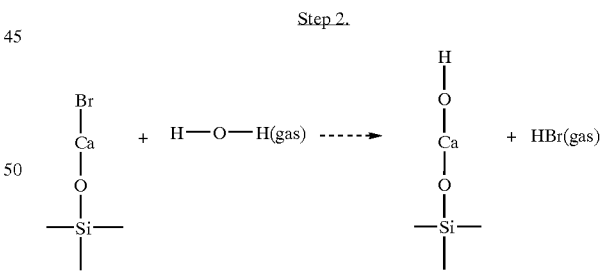

The third step is the ultimate deposition of calcium oxide by first transporting calcium (gas) at a controlled flow rate to create a monolayer of calcium on the wafer. This transport is followed by transporting water (gas) to the wafer. The hydroxylation reaction, $Ca+2H_2O \rightarrow Ca(OH)_2+H_2$, occurs even at room temperature. The wafer is heated to temperatures in the range of 600° C. to 800° C. in order to overcome possible kinetic barriers to the reaction shown in Step 3.

The sequential process (depositing calcium followed by exposure to gaseous water and heat) is repeated until the desired thickness of dielectric is obtained. At every thermal step a bimolecular condensation occurs such as displayed in Step 3. Shown schematically is an early stage in the third-step deposition process:

During early Step 3.

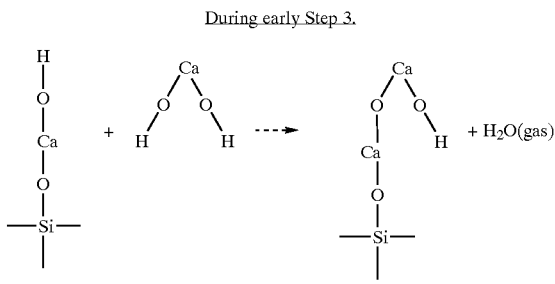

Figure 2:
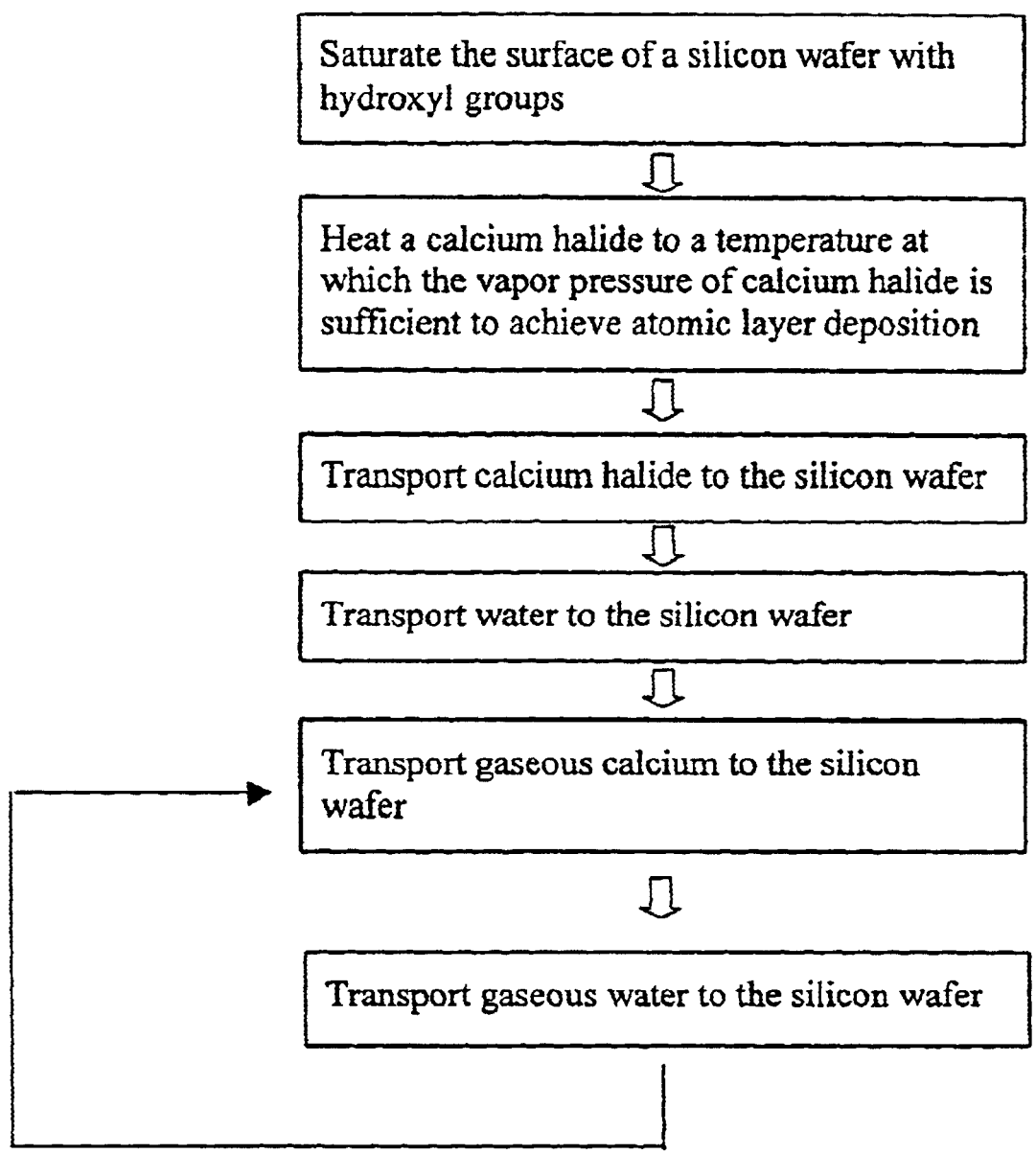
FIG. 2 is a block diagram of one embodiment of the method of the present invention.

The procedure also is presented schematically in FIG. 2. The result is an amorphous layer of calcium oxide, grown to the thickness required by the application for which the material will be used.

The first two steps in this process are atomic layer deposition; they are self-limiting. Step 3 represents atomic layer epitaxy; it is less restrictive but not self-limiting.

Figure 3:
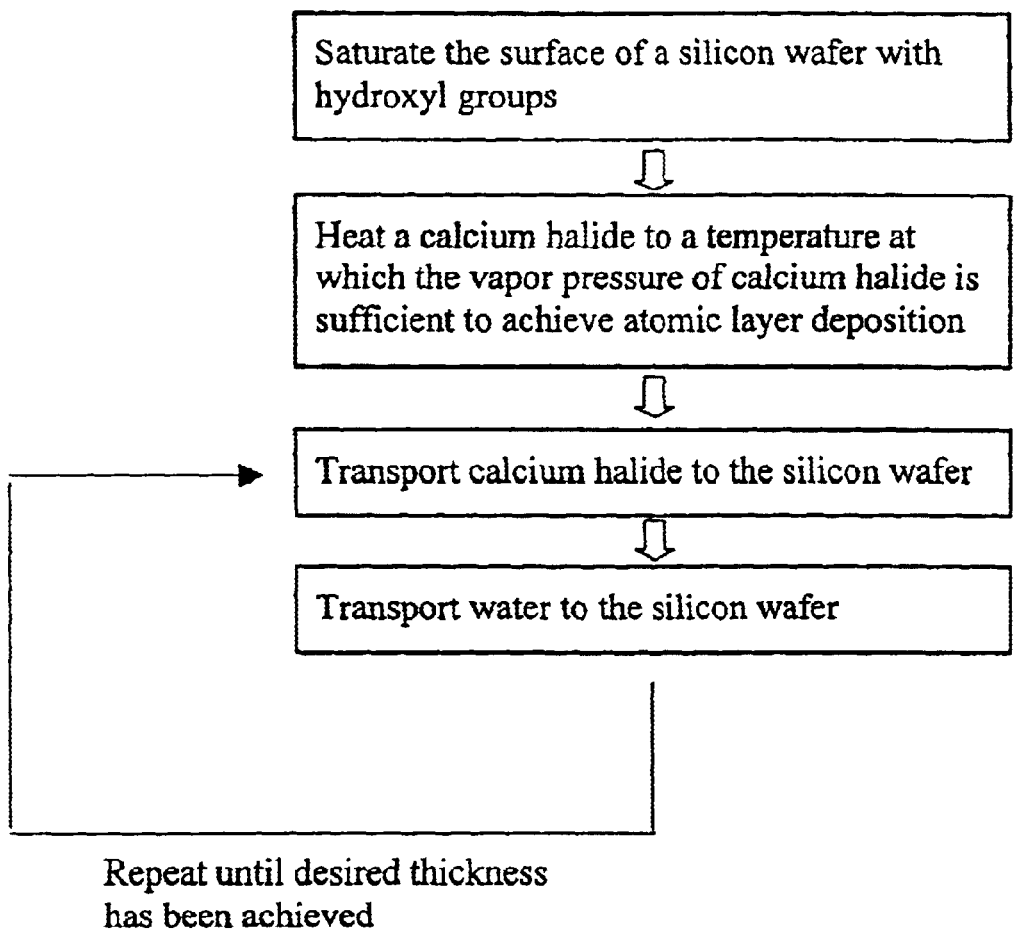
FIG. 3 is a block diagram of another embodiment of the method of the present invention.

An alternative procedure that would be a self-limiting atomic layer deposition process utilizes the reactions in steps 1 and 2. Here a calcium halide in the vapor state, preferably $CaBr_2$, is transported to the surface after step 2. The surface is heated to a sufficiently high temperature that the condensation process depicted in step 1 occurs. Unreacted $CaBr_2$ is vaporized in this procedure. Gaseous water, transported by a heated carrier gas, then is introduced. As shown in Step 2, the gaseous water will hydroxylate the calcium and release HBr. The process is continued until a desired deposition thickness is achieved. This alternative procedure is shown in FIG. 3.

Since, as calculations show, calcium oxide does not display any effective electron affinity, if the density of structural defects is low, trapping of electrons will be markedly reduced. Accordingly, this feature of no electron affinity, which is also calculated for an ideal $SiO_2$, is a desirable one for a gate dielectric.

Boron penetration from a heavily doped $p^+$ polysilicon gate at temperatures currently used for annealing is a problem. Calculations show that calcium oxide exhibits a very high barrier (approximately 4 eV) to such penetration and subsequent diffusion. This feature is particularly attractive for a gate dielectric. Therefore, calcium oxide formed in this unique manner will act as an effective, high-k dielectric gate material.

While preferred embodiments of the present invention are shown and described, it is envisioned that those skilled in the art may devise various modifications of the present invention without departing from the spirit and scope of the appended claims.

We claim:

1. A method of preparing a dielectiic gate material to reduce current leakage from a silicon substrate to a polysilicon gate, prevent boron penetration in a p-channel device, and reduce electron trapping in the dielectric, comprising saturating the surface of a silicon wafer with hydroxyl groups, heating a calcium halide to a temperature at which the vapor pressure of said calcium halide is sufficient to achieve atomic layer deposition, transporting said calcium halide to said silicon wafer, and transporting gaseous water to said silicon wafer.

2. A method according to claim 1, wherein said calcium halide is calcium bromide.

3. A method according to claim 1, further comprising repeating the steps of transporting said calcium halide to said silicon wafer and transporting gaseous water to said silicon wafer, until a desired thickness of the dielectric gate material has been achieved.

4. A method according to claim 3, wherein said calcium halide is calcium bromide.

5. A dielectric gate material to reduce current leakage from the silicon substrate to the polysilicon gate, prevent boron penetration in p-channel devices, and reduce electron trapping in the dielectric, manufactured by the steps of:

saturating the surface of a silicon wafer with hydroxyl groups, heating a calcium halide to a temperature at which the vapor pressure of said calcium halide is sufficient to achieve atomic layer deposition.

transporting said calcium halide to said silicon wafer, and transporting gaseous water to said silicon wafer.

6. The dielectric gate material of claim 5, wherein said calcium halide is calcium bromide.

7. The dielectric gate material of claim 5, further comprising repeating the steps of transporting said calcium halide to said silicon wafer and transporting gaseous water to said silicon wafer, until a desired thickness of the dielectric gate material has been achieved.

8. The dielectric gate material of claim 7, wherein said calcium halide is calcium bromide.

* * * * *